United States Patent
Kobayashi et al.

(10) Patent No.: US 9,219,362 B2
(45) Date of Patent: Dec. 22, 2015

(54) POWER SUPPLY CIRCUIT

(75) Inventors: Shigeto Kobayashi, Anpachi-gun (JP); Kouichi Yamada, Hashima-Gun (JP); Yoshitaka Ueda, Ogaki (JP); Atsushi Wada, Ogaki (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 859 days.

(21) Appl. No.: 13/008,414

(22) Filed: Jan. 18, 2011

(65) Prior Publication Data

US 2011/0175449 A1    Jul. 21, 2011

(30) Foreign Application Priority Data

Jan. 20, 2010  (JP) ................................ 2010-010304

(51) Int. Cl.
*H02J 1/10* (2006.01)
*H02J 1/08* (2006.01)
*H03K 19/0175* (2006.01)
(Continued)

(52) U.S. Cl.
CPC .............. *H02J 1/08* (2013.01); *H03K 19/0175* (2013.01); *G06F 1/26* (2013.01); *H03L 5/00* (2013.01); *Y10T 307/50* (2015.04)

(58) Field of Classification Search
CPC .............. H02J 1/10; H02J 1/102; H02J 7/35; H02J 1/00; H02J 3/00; H02J 3/38; H02J 3/14; Y02E 60/12; G06F 1/26; H03K 19/0185; H03K 19/0175; H03L 5/00; G11C 16/06
USPC ............. 307/72, 43, 1; 327/530, 520; 363/77, 363/79; 362/23.04, 630
See application file for complete search history.

(56) References Cited

U.S. PATENT DOCUMENTS 6,046,624 A * 4/2000 Nam ....................... G05F 1/465 327/108
6,566,935 B1 * 5/2003 Renous ..................... G05F 1/59 307/126

(Continued)

FOREIGN PATENT DOCUMENTS

CN    1679236 A    10/2005
JP    9-130996 A    5/1997
(Continued)

OTHER PUBLICATIONS

Japanese Office Action issued in Japanese Application No. 2010-010304 mailed May 7, 2013.

*Primary Examiner* — Rexford Barnie
*Assistant Examiner* — Jagdeep Dhillon (57) ABSTRACT

A power supply circuit generates the internal power supply voltage intVCC from a first power supply capable of supplying a first power supply voltage V1 and a second power supply capable of supplying a second power supply voltage V2, which is lower than the first power supply voltage V1. A first transistor TR1 is provided between the first power supply and an output node, whereas a second transistor TR2 is provided between the second power supply and the output node. A first supply unit supplies the inverted value of an output voltage of the first power supply or the inverted value of a voltage corresponding to the output voltage of the first power supply, to the gate input of the first transistor TR1. A second supply unit supplies the output voltage of the first power supply or the voltage corresponding to the output voltage of the first power supply, to the gate input of the second transistor TR2.

20 Claims, 7 Drawing Sheets

(51) Int. Cl.
*G06F 1/26* (2006.01)
*H03L 5/00* (2006.01)

(56) References Cited

U.S. PATENT DOCUMENTS

| | | | | |
|---|---|---|---|---|
| 6,750,676 | B1* | 6/2004 | Honda | H03K 17/04123 |
| | | | | 326/63 |
| 7,031,219 | B2* | 4/2006 | Hsu | G11C 5/147 |
| | | | | 365/185.23 |
| 7,414,330 | B2* | 8/2008 | Chen | H02J 1/10 |
| | | | | 307/112 |
| 7,924,080 | B2* | 4/2011 | Uchino | H03K 3/356113 |
| | | | | 326/63 |
| 8,183,713 | B2* | 5/2012 | Rao | H03K 19/00361 |
| | | | | 307/38 |
| 2005/0127977 | A1 | 6/2005 | Itoh | |
| 2008/0001628 | A1* | 1/2008 | Nagata | H03K 19/018521 |
| | | | | 326/63 |

FOREIGN PATENT DOCUMENTS

| | | |
|---|---|---|
| JP | 2005-312218 A | 11/2005 |
| JP | 2008-118732 A | 5/2008 |
| JP | 2009-071534 | 4/2009 |

\* cited by examiner

POWER SUPPLY CIRCUIT

This application is based upon and claims the benefit of priority from the prior Japanese Patent Application No. 2010-010304, filed Jan. 20, 2010, the entire contents of which are incorporated herein by reference.

BACKGROUND OF THE INVENTION

1. Field of the Invention

The present invention relates to a power supply circuit for generating an internal power supply voltage from one or more power supplies.

2. Description of the Related Art

Proposed in a conventional practice is a power supply management circuit that controls the operation of an electronic device by either a voltage supplied from an external power supply or a voltage from a battery. This power supply management circuit includes a voltage comparator circuit for comparing the voltage from the external power supply with the voltage from the battery, and a selection circuit for selecting either one of the voltages in response to an output signal of the voltage comparator circuit.

Since the power supply management circuit in the above-described conventional practice includes the voltage comparator circuit, the circuitry configuration thereof is complicated and the circuit scale thereof is large. Where the power supply management circuit (hereinafter referred to as "power supply circuit") is incorporated into a mobile electronic device, an increase in the circuit scale is undesirable in the light of a demand for reduced size of the electronic devices.

Also, when the power supply circuit generates the internal power supply voltage from more than a single power supply circuit, a drop in power supply voltage supplied therefrom is undesirable and it is desired that the power supply voltage be maintained as long as possible.

SUMMARY OF THE INVENTION

The present invention has been made in view of the foregoing circumstances, and a purpose thereof is to provide a technology for efficiently generating the internal power supply voltage from more than one power supplies.

In order to resolve the above-described problems, a power supply circuit according to one embodiment of the present invention generates an internal power supply voltage from a first power supply capable of supplying a first power supply voltage and a second power supply capable of supplying a second power supply voltage, which is lower than the first power supply voltage, and the power supply circuit comprises: a first transistor provided between the first power supply and an output node; a second transistor provided between the second power supply and the output node; a first supply unit configured to supply the inverted value of an output voltage of the first power supply or the inverted value of a voltage corresponding to the output voltage of the first power supply, to a gate input of the first transistor; and a second supply unit configured to supply the output voltage of the first power supply or the voltage corresponding to the output voltage of the first power supply, to a gate input of the second transistor.

It is to be noted that any arbitrary combinations or rearrangement of the aforementioned structural components and so forth are all effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Figure 1:
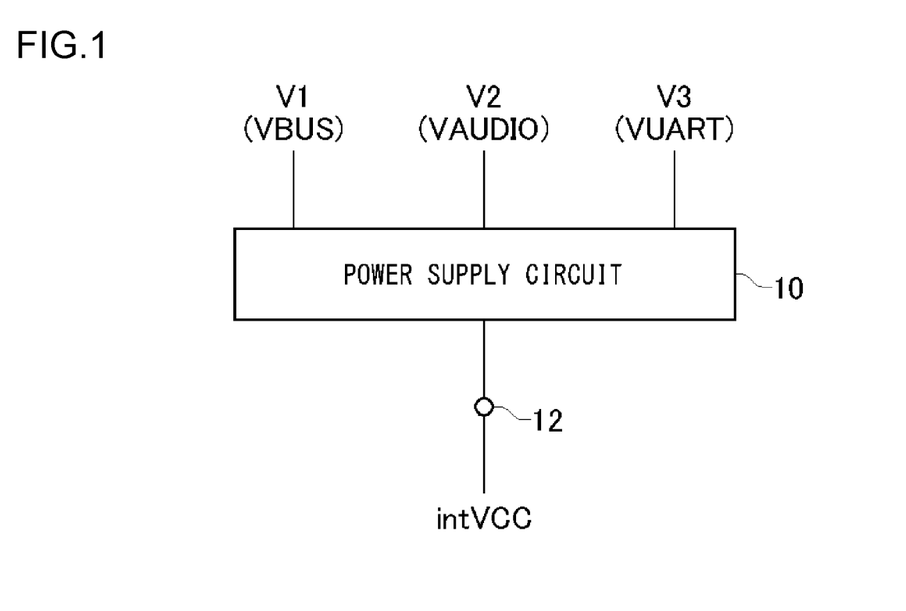
FIG. 1 shows a power supply circuit according to an embodiment of the present invention.

FIG. 1 shows a power supply circuit 10 according to an embodiment of the present invention. The power supply circuit 10 is incorporated into a portable device such as a mobile phone and a personal digital assistant (PDA) and may be connected to a plurality of power supplies. The power supply circuit 10 is connected to a plurality of power supplies including an external power supply. Also, the power supply circuit 10 is configured as a switching circuit that outputs an internal power supply voltage intVCC, which is used as a control voltage in an electronic device, from an output node 12. It is to be noted here the power supply circuit 10 may be installed in an electronic device other than the portable devices.

For example, when the power supply circuit 10 is connected to an external personal computer (PC) through a universal serial bus (USB), a power supply voltage VBUS is supplied to the power supply circuit 10. Where such an electronic device is equipped with a media processor for generating audio signals, an power supply voltage VAUDIO is supplied to the power supply circuit 10 from an internal battery. Also, a power supply voltage (VUART) for use in a universal asynchronous receiver transmitter (UART) may be supplied to the power supply circuit 10. In the following first to fifth embodiments, a power supply capable of supplying a first power supply voltage V1 (e.g., VBUS) is called "first power supply", a power supply capable of supplying a second power supply voltage V2 (e.g., VAUDIO) is called "second power supply", and a power supply capable of supplying a third power supply voltage V3 (e.g., VUART) is called "third power supply". Also, it is assumed herein that a relation V1>V2>V3 holds in the following first to fifth embodiments. Note that the type of the power supply is not limited to VBUS, VAUDIO and VUART only and it may be other than those.

The power supply voltage supplied to the power supply circuit 10 varies depending on whether there is any external device connected to power supply circuit 10 or not. For example, if an electronic device installing the power supply circuit 10 is not connected to any external device through the USB, no power supply voltage VBUS will be supplied from the exterior. In this manner, the type of a power supply connected to the power supply circuit 10 varies depending on a connection environment, an operation environment and the like of the electronic device. Thus, the power supply circuit 10 preferably has a function of efficiently generating the internal power supply voltage intVCC according to the power supply to which the power supply circuit is connected. The internal power supply voltage intVCC is inputted to an N-channel transistor included in a load circuit as a gate voltage. Thus, of a plurality of power supplies connected thereto, the power supply circuit 10 preferably outputs the maximum power supply voltage in order to instantly turn on the N-channel transistor.

Figure 2A:
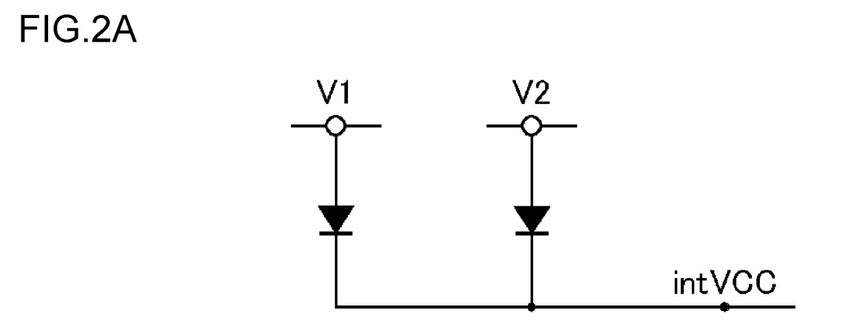
FIG. 2A shows an example of a power supply circuit that outputs an internal power supply voltage using diodes.

FIG. 2A shows an example of a power supply circuit, which outputs the internal power supply voltage intVCC, where a plurality of power supplies are connected to diodes, respectively. In this power supply circuit, when connected to the diodes, prevents the current from flowing in the reverse direction. If a first power supply and a second power supply are connected to this power supply circuit, the output of the power supply circuit will be a voltage which is less than the first power supply voltage V1 (>V2) by a forward voltage VF. Note that if only one of the first power supply and the second power supply is connected, the output voltage will be a voltage which is lower than the voltage of a power supply connected thereto by the forward voltage VF.

Figure 2B:
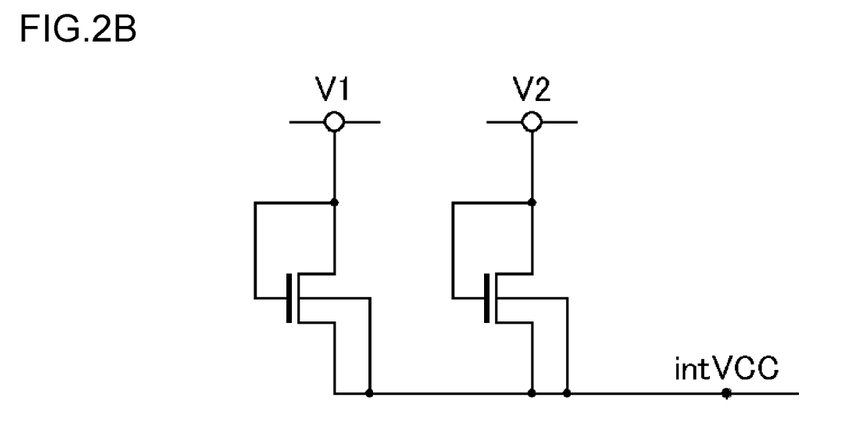
FIG. 2B shows an example of a power supply circuit that outputs an internal power supply voltage using an N-channel transistor.

FIG. 2B shows an example of a power supply circuit, which outputs the internal power supply voltage intVCC, where a plurality of power supplies are connected to N-channel transistors, respectively. Similar to the power supply circuit shown in FIG. 2A, this power supply circuit of FIG. 2B is so configured as to prevent the current from flowing in the reverse direction. If a first power supply and a second power supply are connected to this power supply circuit, the output of the power supply circuit will be a voltage which is less than the first power supply voltage V1 (>V2) by a threshold voltage Vth. Note that if only one of the first power supply and the second power supply is connected, the output voltage will be a voltage which is lower than the voltage of a power supply connected thereto by the threshold voltage Vth.

As described above, the power supply circuits as shown in FIGS. 2A and 2B output voltages based on the maximum power supply voltage but the output voltages thereof are lower than the power supply voltages supplied thereto. Note that the power supply management circuit in the above-described conventional practice uses N-channel transistors as a switch and therefore a voltage loss occurs as explained in conjunction with FIG. 2B.

In the light of the above, a description is given hereunder of a power supply circuit 10, capable of outputting the maximum voltage, when a plurality of power supplies are connected, which does not suffer the voltage drop from the power supply voltage supplied thereto.

First Embodiment

Figure 3:
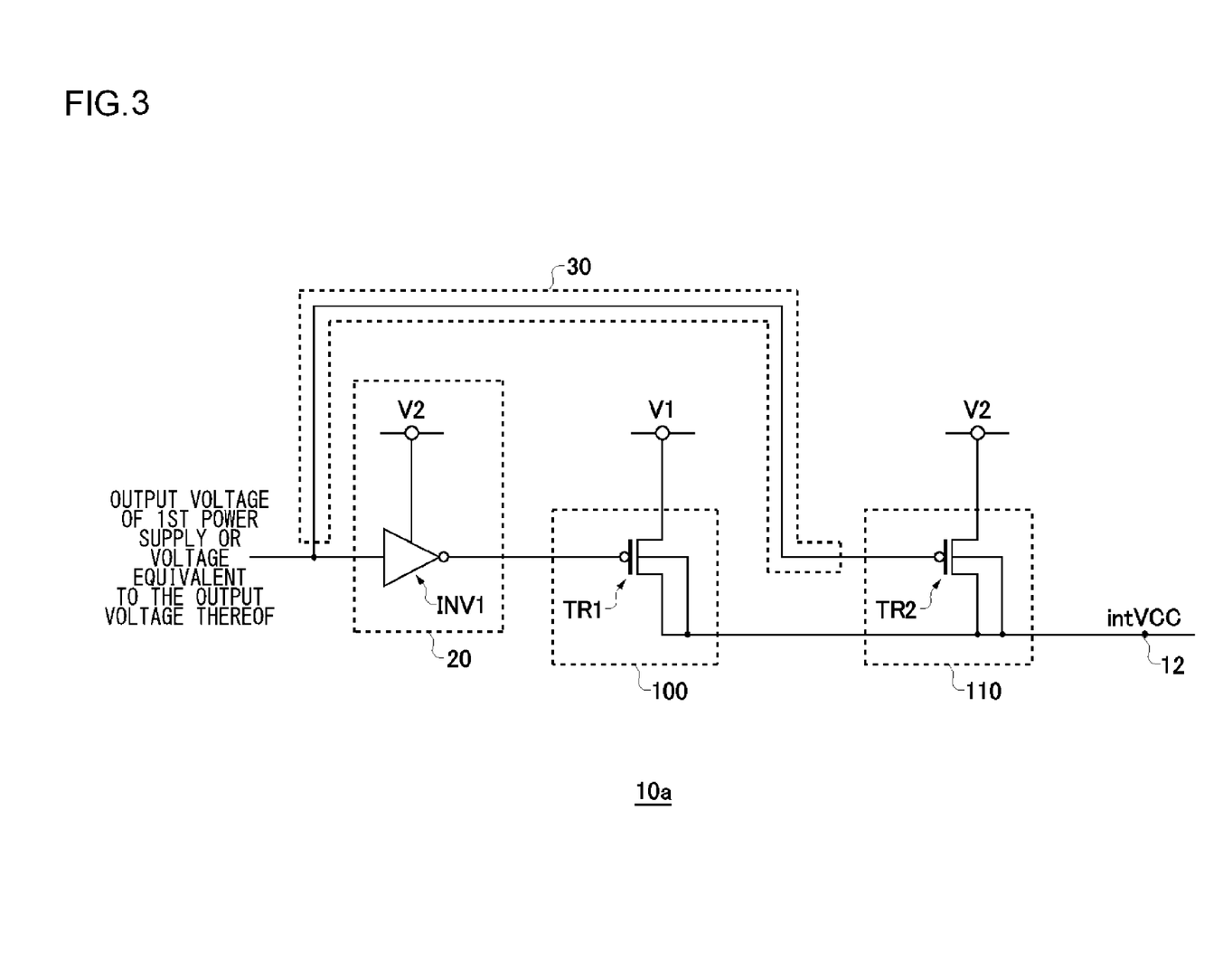
FIG. 3 shows a configuration of a power supply circuit according to a first embodiment of the present invention.

FIG. 3 shows a configuration of a power supply circuit 10a according to a first embodiment of the present invention. The power supply circuit 10a generates the internal power supply voltage intVCC from a first power supply and a second power supply and then outputs the intVCC to a load circuit (not shown) from an output node 12. As described earlier, the first power supply voltage V1 is greater than the second power supply voltage V2 (V1>V2). Note that in the power supply circuit 10a, the power supply voltage is not constantly supplied from the first power supply and the second power supply and there are cases where one of the first power supply and the second power supply is not connected. In this patent specification, the output voltage is called "high" or "high level" if the power supply is connected, whereas the output voltage is called "low" or "low level" if the power supply is not connected or the power supply does not supply the voltage. For convenience in explanation, FIG. 3 shows that the first power supply and the second power supply are connected and that the first power supply voltage V1 and the second power supply voltage V2 are supplied to the power supply circuit 10a. If, for example, the first power supply is not connected, a lower level (0 V) is supplied to the power supply circuit 10a as the output voltage of the first power supply. The same applies also to the second power supply.

The power supply circuit 10a includes a first switching circuit 100, provided between the first power supply and the output node 12, and a second switching circuit 110, provided between the second power supply and the output node 12. The first switching circuit 100 includes a first transistor TR1, whereas the second switching circuit 110 includes a second transistor TR2. The first transistor TR1 and the second transistor TR2 are each a P-channel MOS transistor. The power supply circuit 10a further includes (i) a first supply unit 20 for supplying the inverted value of an output voltage of the first power supply or the inverted value of a voltage corresponding to the output voltage of the first power supply, to a gate input of the first transistor TR1 and (ii) a second supply unit 30 for supplying the output voltage of the first power supply or the voltage corresponding to the output voltage of the first power supply, to a gate input of the second transistor TR2. Here, the "voltage corresponding to an output voltage of the first power supply" is a voltage whose logic level is equal to that of the output voltage of the first power supply. In other words, if the first power supply is connected to the power supply circuit 10a, the output voltage of the first power supply will be a high-level first power supply voltage V1. At this time the voltage corresponding to the output voltage of the first power supply may likewise be a high-level voltage and, for example, it may be greater than or equal to the first power supply voltage V1. If the first power supply is not connected to the power supply circuit 10a, the output voltage of the first power supply will be a low level (0 V). At this time the voltage corresponding to the output voltage of the first power supply may likewise be a low-level voltage and, for example, it may be of a voltage level enough to turn on the second transistor TR2.

The first transistor TR1 is configured such that a source thereof is connected to the first power supply and a drain thereof is connected to the output node 12. The second transistor TR2 is configured such that a source thereof is connected to the second power supply and a drain thereof is connected to the output node 12. The first supply unit 20 has a first inverter INV1 that receives the output voltage of the first power supply and outputs a voltage made by logically inverting the output voltage of the first power supply. If the second power supply is connected, the first inverter INV1 will be driven with the second power supply voltage V2 as the power supply voltage. The second supply unit 30 has a wiring through which the output voltage of the first power supply is supplied to the gate of the second transistor TR2.

In the first embodiment, the first power supply capable of supplying the first power supply voltage V1 may be an external power supply. As the first power supply is connected to the power supply circuit 10a, the first supply unit 20 receives an input of the first power supply voltage V1 and outputs a low-level voltage to the gate input of the first transistor TR1. At this time the first transistor TR1 is turned on. If, on the other hand, the first power supply is not connected to the power supply circuit 10a, the first supply unit 20 will not receive the input of the first power supply voltage V1 and therefore it will output a high-level voltage to the gate input of the first transistor TR1. At this time, the first transistor TR1 is not turned on.

A description is now given of an operation of the power supply circuit 10a shown in FIG. 3 wherein the power supply voltage supplied when the power supply is connected is denoted by an H value and the power supply voltage supplied when the power supply is not connected is denoted by an L value (=0 V). For convenience in explanation, the following expression will be used, for instance. That is, V1 is an H value when the first power supply is connected to the power supply circuit 10a, whereas V1 is an L value when the first power supply is not connected to the power supply circuit 10a.

(Case 1-1: V1 is an H Value, and V2 is an H Value)

When V1 and V2 are each an H value, the first supply unit 20 supplies a low-level voltage to the gate input of the first transistor TR1, and the second supply unit 30 supplies a high-level voltage to the gate input of the second transistor TR2. Thus, the first transistor TR1 is turned on, and the second transistor TR2 is turned off. As a result, the internal power supply voltage intVCC is the first power supply voltage V1. In other words, when the first power supply and the second power supply are connected to the power supply circuit 10a, the first power supply voltage V1, which is the largest of V1 and V2, is outputted as the internal power supply voltage intVCC.

(Case 1-2: V1 is an H Value, and V2 is an L Value)

When V1 is an H value and V2 is an L value, the first supply unit 20 supplies a low-level voltage to the gate input of the first transistor TR1, and the second supply unit 30 supplies a high-level voltage to the gate input of the second transistor TR2. Thus, the first transistor TR1 is turned on, and the second transistor TR2 is turned off. As a result, the internal power supply voltage intVCC is the first power supply voltage V1.

(Case 1-3: V1 is an L Value, and V2 is an H Value)

When V1 is an L value and V2 is an H value, the first supply unit 20 supplies a high-level voltage to the gate input of the first transistor TR1, and the second supply unit 30 supplies a low-level voltage to the gate input of the second transistor TR2. Thus, the first transistor TR1 is turned off, and the second transistor TR2 is turned on. As a result, the internal power supply voltage intVCC is the second power supply voltage V2.

As described above, the power supply circuit 10a has the following functions. That is, the power supply circuit 10a supplies a larger power supply voltage as the internal power supply voltage intVCC when a plurality of power supplies are connected. Where a single power supply is connected, the power supply circuit 10a outputs the power supply voltage of said single power supply as the internal power supply voltage intVCC. The power supply circuit 10a can efficiently generate the internal power supply voltage intVCC without causing a substantial voltage drop between the interval power supply voltage intVCC and the power supply voltage. Also, since the power supply circuit 10a is a digital circuitry and therefore simply constructed, so that the overall size of the power supply circuit 10a can be made smaller.

Second Embodiment

Figure 4:
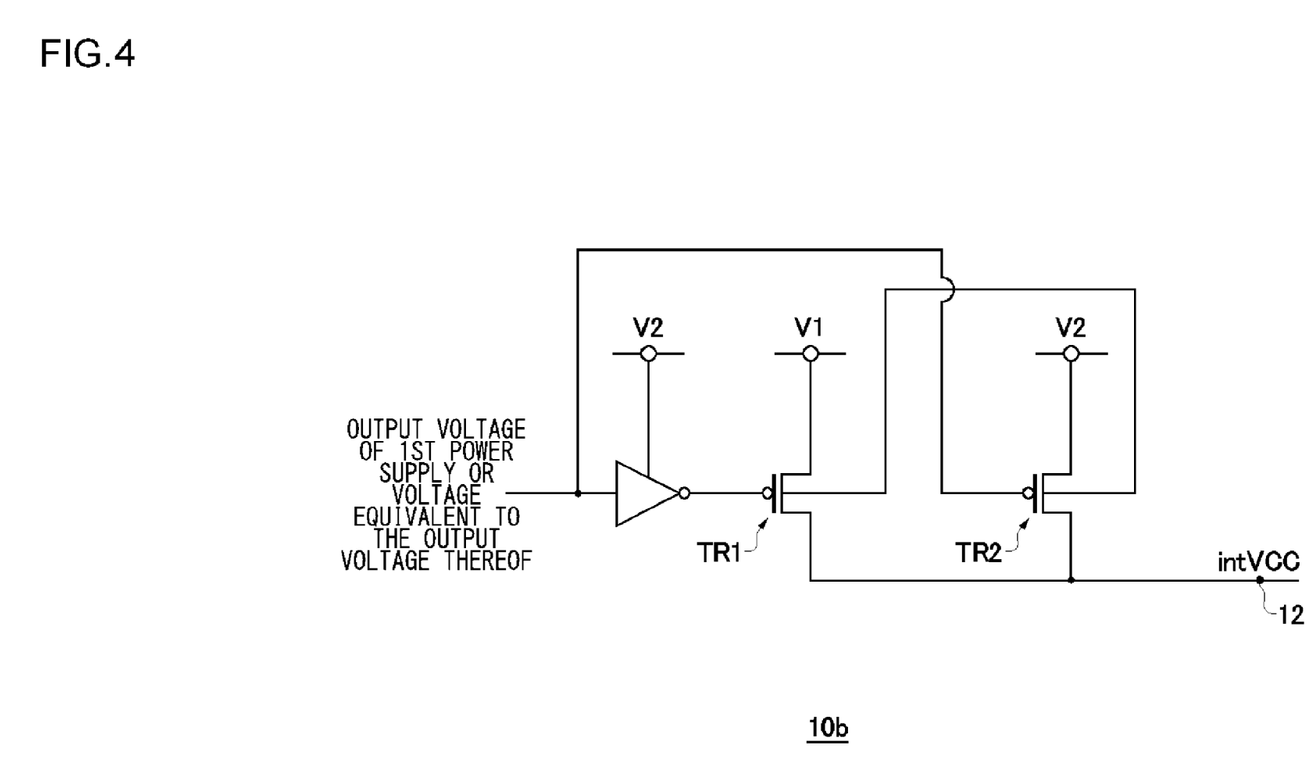
FIG. 4 shows a configuration of a power supply circuit according to a second embodiment of the present invention.

FIG. 4 shows a configuration of a power supply circuit 10b according to a second embodiment of the present invention. Similar to FIG. 3, FIG. 4 shows a state where the first power supply and the second power supply are connected and the first power supply voltage V1 and the second power supply voltage V2 are supplied to the power supply circuit 10b. As compared with the power supply circuit 10a shown in FIG. 3, the power supply circuit 10b is configured such that a back-gate of the first transistor TR1 and a back-gate of the second transistor TR2 are connected to each other in contrast to the power supply circuit 10a where the back-gate of the first transistor TR1 and the back-gate of the second transistor TR2 are each connected to the output node 12. By employing the configuration of the power supply circuit 10b as described above, the power supply and the output node 12 are not connected by a PN diode, so that the situation in which the power supply voltage passes through the output node 12 from the back-gates of the transistors can be avoided.

Third Embodiment

Figure 5:
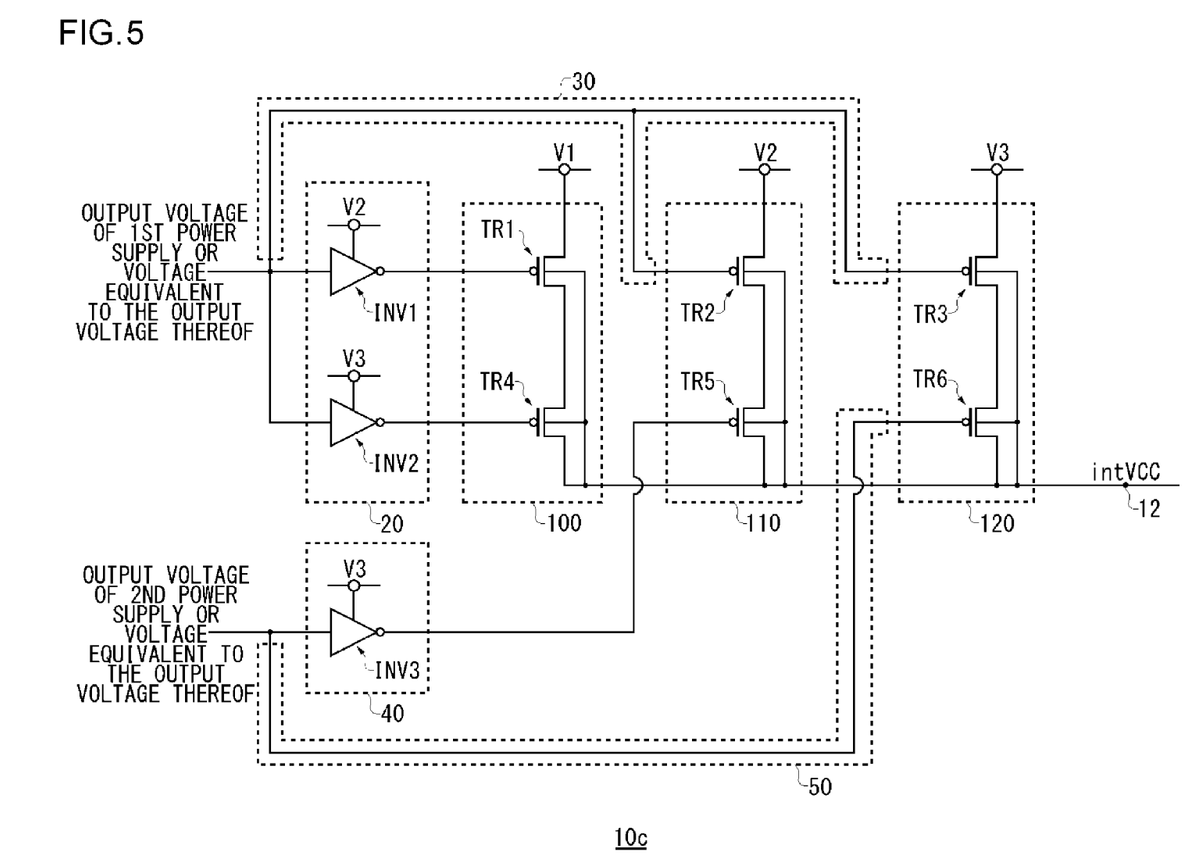
FIG. 5 shows a configuration of a power supply circuit according to a third embodiment of the present invention.

FIG. 5 shows a configuration of a power supply circuit 10c according to a third embodiment of the present invention. The power supply circuit 10c generates the internal power supply voltage intVCC from a first power supply, a second power supply and a third power supply and then outputs the intVCC to a load circuit (not shown) from an output node 12. As described earlier, the first power supply voltage V1 is greater than the second power supply voltage V2, and the second power supply voltage is greater than the third power supply voltage V3 (V1>V2>V3). Note that in the power supply circuit 10c, the power supply voltage is not constantly supplied from the first power supply, the second power supply and the third power supply and, in some cases, any one or two of the first power supply, the second power supply and the third power supply is (are) not connected. For convenience in explanation, FIG. 5 shows that the first power supply, the second power supply and the third power supply are all connected and that the first power supply voltage V1, the second power supply voltage V2 and the third power supply voltage V3 are supplied to the power supply circuit 10c. If, for example, the first power supply is not connected, a lower level (0 V) is supplied to the power supply circuit 10c as the output voltage of the first power supply. The same applies also to the second power supply and the third power supply.

The power supply circuit 10c includes a first switching circuit 100, provided between the first power supply and the output node 12, a second switching circuit 110, provided between the second power supply and the output node 12, and a third switching circuit 120, provided between the third power supply and the output node 12. The first switching circuit 100 includes a first transistor TR1 and a fourth transistor TR4. The second switching circuit 110 includes a second transistor TR2 and a fifth transistor TR5. The third switching circuit 120 includes a third transistor TR3 and a sixth transistor TR6. The first transistor TR1, the second transistor TR2, the third transistor TR3, the fourth transistor TR4, the fifth transistor TR5 and the sixth transistor TR6 are each a P-channel MOS transistor.

The power supply circuit 10c further includes (i) a first supply unit 20 for supplying the inverted value of an output voltage of the first power supply or the inverted value of a voltage corresponding to the output voltage of the first power supply, to gate inputs of the first transistor TR1 and the fourth transistor TR4 and (ii) a second supply unit 30 for supplying the output voltage of the first power supply or the voltage corresponding to the output voltage of the first power supply, to gate inputs of the second transistor TR2 and the third transistor TR3. The power supply circuit 10c further includes (iii) a third supply unit 40 for supplying the inverted value of an output voltage of the second power supply or the inverted value of a voltage corresponding to the output voltage of the second power supply, to a gate input of the fifth transistor TR5 and (iv) a fourth supply unit 50 for supplying the output voltage of the second power supply or the voltage corresponding to the output voltage of the second power supply, to a gate input of the sixth transistor TR6.

Here, the "voltage corresponding to an output voltage of the first power supply" is a voltage whose logic level is equal to that of the output voltage of the first power supply. In other words, if the first power supply is connected to the power supply circuit 10c, the output voltage of the first power supply will be a high-level first power supply voltage V1. At this time the voltage corresponding to the output voltage of the first power supply may likewise be a high-level voltage and, for example, it may be greater than or equal to the first power supply voltage V1. If the first power supply is not connected to the power supply circuit 10c, the output voltage of the first power supply will be a low level (0 V). At this time the voltage corresponding to the output voltage of the first power supply may likewise be a low-level voltage and, for example, it may be of a voltage level enough to turn on the second transistor TR2 and the third transistor TR3.

Similarly, the "voltage corresponding to an output voltage of the second power supply" is a voltage whose logic level is equal to that of the output voltage of the second power supply. In other words, if the second power supply is connected to the power supply circuit 10c, the output voltage of the second power supply will be a high-level second power supply voltage V2. At this time the voltage corresponding to the output voltage of the second power supply may likewise be a high-level voltage and, for example, it may be greater than or equal to the second power supply voltage V2. If the second power supply is not connected to the power supply circuit 10c, the output voltage of the second power supply will be a low level (0 V). At this time the voltage corresponding to the output voltage of the second power supply may likewise be a low-level voltage and, for example, it may be of a voltage level enough to turn on the sixth transistor TR6.

In the first switching circuit 100, a source of the first transistor TR1 is connected to the first power supply, and a drain of the first transistor TR1 is connected to a source of the fourth transistor TR4. A drain of the fourth transistor TR4 is connected to the output node 12. In the second switching circuit 110, a source of the second transistor TR2 is connected to the second power supply, and a drain of the second transistor TR2 is connected to a source of the fifth transistor TR5. A drain of the fifth transistor TR5 is connected to the output node 12. In the third switching circuit 120, a source of the third transistor TR3 is connected to the third power supply, and a drain of the third transistor TR3 is connected to a source of the sixth transistor TR6. A drain of the sixth transistor TR6 is connected to the output node 12.

The first supply unit 20 has a first inverter INV1 and a second inverter INV2 that each receives the output voltage of the first power supply and each outputs a voltage made by logically inverting the output voltage of the first power supply. If the second power supply is connected, the first inverter INV1 will be driven with the second power supply voltage V2 as the power supply voltage and will supply the inverted value of the output voltage of the first power supply to the gate input of the first transistor TR1. If the third power supply is connected, the second inverter INV2 will be driven with the third power supply voltage V3 as the power supply voltage and will supply the inverted value of the output voltage of the first power supply to the gate input of the fourth transistor TR4. The second supply unit 30 has a wiring through which the output voltage of the first power supply is supplied to the gate input of the second transistor TR2 and gate input of the third transistor TR3.

The third supply unit 40 has a third inverter INV3 that receives the output voltage of the second power supply and outputs a voltage made by logically inverting the output voltage of the second power supply. If the third power supply is connected, the third inverter INV3 will be driven with the third power supply voltage V3 as the power supply voltage and will supply the inverted value of the output voltage of the second power supply to the gate input of the fifth transistor TR5. The fourth supply unit 50 has a wiring through which the output voltage of the second power supply is supplied to the gate input of the sixth transistor TR6.

A description is now given of an operation of the power supply circuit 10c shown in FIG. 5 wherein the power supply voltage supplied when the power supply is connected is denoted by an H value and the power supply voltage supplied when the power supply is not connected is denoted by an L value (=0 V). For convenience in explanation, the following expression will be used, for instance. That is, V1 is an H value when the first power supply is connected to the power supply circuit 10c, whereas V1 is an L value when the first power supply is not connected to the power supply circuit 10c.

(Case 2-1: V1 is an H Value, V2 is an H Value, V3 is an H Value)

When V1, V2 and V3 are each an H value, the first supply unit 20 supplies a low-level voltage to the gate input of the first transistor TR1 and the gate input of the fourth transistor TR4, and the second supply unit 30 supplies a high-level voltage to the gate input of the second transistor TR2 and the gate input of the third transistor TR3. Thus, the first transistor TR1 and the fourth transistor TR4 are turned on, and the second transistor TR2 and the third transistor TR3 are turned off. As a result, the internal power supply voltage intVCC is the first power supply voltage V1. In other words, when the first power supply, the second power supply and the third power supply are connected to the power supply circuit 10c, the first power supply voltage V1, which is the largest of V1, V2 and V3, is outputted as the internal power supply voltage intVCC.

(Case 2-2: V1 is an H Value, V2 is an H Value, V3 is an L Value)

When V1 and V2 are each an H value and V3 is an L value, the first supply unit 20 supplies a low-level voltage to the gate input of the first transistor TR1 and the gate input of the fourth transistor TR4, and the second supply unit 30 supplies a high-level voltage to the gate input of the second transistor TR2 and the gate input of the third transistor TR3. Thus, the first transistor TR1 and the fourth transistor TR4 are turned on, and the second transistor TR2 and the third transistor TR3 are turned off. As a result, the internal power supply voltage intVCC is the first power supply voltage V1. In other words, when the first power supply and the second power supply are connected to the power supply circuit 10c, the first power supply voltage V1, which is larger than V2, is outputted as the internal power supply voltage intVCC.

(Case 2-3: V1 is an H Value, V2 is an L Value, V3 is an H Value)

When V1 and V3 are each an H value and V2 is an L value, the first supply unit 20 supplies a low-level voltage to the gate input of the first transistor TR1 and the gate input of the fourth transistor TR4, and the second supply unit 30 supplies a high-level voltage to the gate input of the second transistor TR2 and the gate input of the third transistor TR3. Thus, the first transistor TR1 and the fourth transistor TR4 are turned on, and the second transistor TR2 and the third transistor TR3 are turned off. As a result, the internal power supply voltage intVCC is the first power supply voltage V1. In other words, when the first power supply and the third power supply are connected to the power supply circuit 10c, the first power supply voltage V1, which is larger than V3, is outputted as the internal power supply voltage intVCC.

(Case 2-4: V1 is an H Value, V2 is an L Value, V3 is an L Value)

When V1 is an H value and V2 and V3 are each an L value, the first supply unit 20 supplies a low-level voltage to the gate input of the first transistor TR1 and the gate input of the fourth transistor TR4, and the second supply unit 30 supplies a high-level voltage to the gate input of the second transistor TR2 and the gate input of the third transistor TR3. Thus, the first transistor TR1 and the fourth transistor TR4 are turned on, and the second transistor TR2 and the third transistor TR3 are turned off. As a result, the internal power supply voltage intVCC is the first power supply voltage V1. In other words, when the first power supply only is connected to the power supply circuit 10c, the first power supply voltage V1 is outputted as the internal power supply voltage intVCC.

As the above-described case 2-1 to case 2-4 indicate, a switching circuit in which the first power supply voltage V1 is prioritized is configured when the first power supply is connected. Thereby, the power supply circuit 10c can generate preferentially the first power supply voltage V1, which is largest of V1, V2 and V3, as the internal power supply voltage intVCC without regard to whether any power supplies other than the first power supply are being connected or not.

(Case 2-5: V1 is an L Value, V2 is an H Value, V3 is an H Value)

When V1 is an L value and V2 and V3 are each an H value, the first supply unit 20 supplies a high-level voltage to the gate input of the first transistor TR1 and the gate input of the fourth transistor TR4, and the second supply unit 30 supplies a low-level voltage to the gate input of the second transistor TR2 and the gate input of the third transistor TR3. Thus, the first transistor TR1 and the fourth transistor TR4 are turned off, and the second transistor TR2 and the third transistor TR3 are turned on. Also, the third supply unit 40 supplies a low-level voltage to the gate input of the fifth transistor TR5, and the fourth supply unit 50 supplies a high-level voltage to the gate input of the sixth transistor TR6. Thus, the fifth transistor TR5 is turned on, and the sixth transistor TR6 is turned off. As a result, the internal power supply voltage intVCC is the second power supply voltage V2. In other words, when the second power supply and the third power supply are connected to the power supply circuit 10c, the second power supply voltage V2, which is larger than V3, is outputted as the internal power supply voltage intVCC.

(Case 2-6: V1 is an L Value, V2 is an H Value, V3 is an L Value)

When V1 and V3 are each an L value and V2 is an H value, the first supply unit 20 supplies a high-level voltage to the gate input of the first transistor TR1 and the gate input of the fourth transistor TR4, and the second supply unit 30 supplies a low-level voltage to the gate input of the second transistor TR2 and the gate input of the third transistor TR3. Thus, the first transistor TR1 and the fourth transistor TR4 are turned off, and the second transistor TR2 and the third transistor TR3 are turned on. Also, the third supply unit 40 supplies a low-level voltage to the gate input of the fifth transistor TR5, and the fourth supply unit 50 supplies a high-level voltage to the gate input of the sixth transistor TR6. Thus, the fifth transistor TR5 is turned on, and the sixth transistor TR6 is turned off. As a result, the internal power supply voltage intVCC is the second power supply voltage V2. In other words, when the second power supply only is connected to the power supply circuit 10c, the second power supply voltage V2 is outputted as the internal power supply voltage intVCC.

(Case 2-7: V1 is an L Value, V2 is an L Value, V3 is an H Value)

When V1 and V2 are each an L value and V3 is an H value, the first supply unit 20 supplies a high-level voltage to the gate input of the first transistor TR1 and the gate input of the fourth transistor TR4, and the second supply unit 30 supplies a low-level voltage to the gate input of the second transistor TR2 and the gate input of the third transistor TR3. Thus, the first transistor TR1 and the fourth transistor TR4 are turned off, and the second transistor TR2 and the third transistor TR3 are turned on. Also, the third supply unit 40 supplies a high-level voltage to the gate input of the fifth transistor TR5, and the fourth supply unit 50 supplies a low-level voltage to the gate input of the sixth transistor TR6. Thus, the fifth transistor TR5 is turned off, and the sixth transistor TR6 is turned on. As a result, the internal power supply voltage intVCC is the third power supply voltage V3. In other words, when the third power supply only is connected to the power supply circuit 10c, the third power supply voltage V3 is outputted as the internal power supply voltage intVCC.

As described above, the power supply circuit 10c has the following functions. That is, the power supply circuit 10c supplies a larger power supply voltage as the internal power supply voltage intVCC when a plurality of power supplies are connected. Where a single power supply is connected, the power supply circuit 10c outputs the power supply voltage of said single power supply as the internal power supply voltage intVCC. The power supply circuit 10c can efficiently generate the internal power supply voltage intVCC without causing a substantial voltage drop between the interval power supply voltage intVCC and the power supply voltage. Also, since the power supply circuit 10c is a digital circuitry and therefore simply constructed, so that the overall size of the power supply circuit 10c can be made smaller.

Fourth Embodiment

Figure 6:
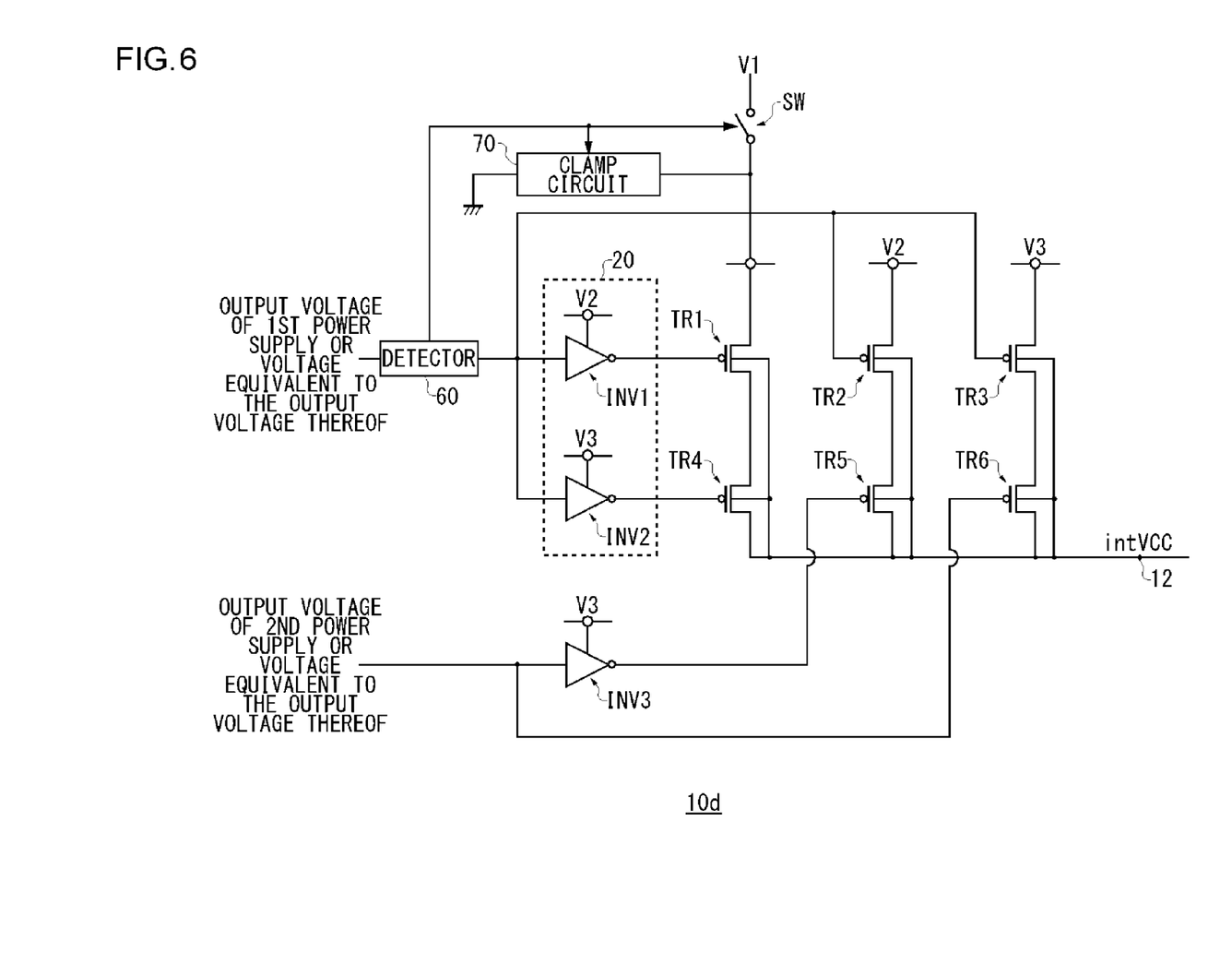
FIG. 6 shows a configuration of a power supply circuit according to a fourth embodiment of the present invention.

FIG. 6 shows a configuration of a power supply circuit 10d according to a fourth embodiment of the present invention. In the power supply circuit 10c as shown in FIG. 5, the output voltage of the first power supply is inputted to the first supply unit 20. In contrast thereto, the power supply circuit 10d as shown in FIG. 6 is configured such that an output of a sensor 60 is inputted to the first supply unit 20. Also, in the power supply circuit 10d, the source of the first transistor TR1 is connected to the first power supply via a switch SW.

The detector 60 is a circuit configured to detect whether the first power supply is connected to the power supply circuit 10d or not; the detector 60 outputs an H signal when the first power supply is connected, and outputs an L signal when it is not connected. The detector 60 determines whether the first power supply is connected or not, based on whether the voltage level exceeds a predetermined threshold value or not. The switch SW conducts (turns on) by an H signal fed from the detector 60 and is shut off (turns off) by an L signal. The level of an H signal may be equal to the first power supply voltage V1. However, in practice, the level of an H signal may be equal to a voltage corresponding to the first power supply voltage V1. That is, the level of an H signal may be equal to a voltage which is recognized as a high level by the first supply unit 20. While the switch SW is turned off, the first power supply voltage V1 is not supplied to the power supply circuit 10d. In this case, 0V clamped by a clamp circuit 70 is received as the output voltage of the first power supply. Though the detector 60, the switch SW and the clamp circuit 70 are provided for the first power supply in the power supply circuit 10d, they may be provided for the other power supplies which are the second power supply and the third power supply as well.

Fifth Embodiment

Figure 7:
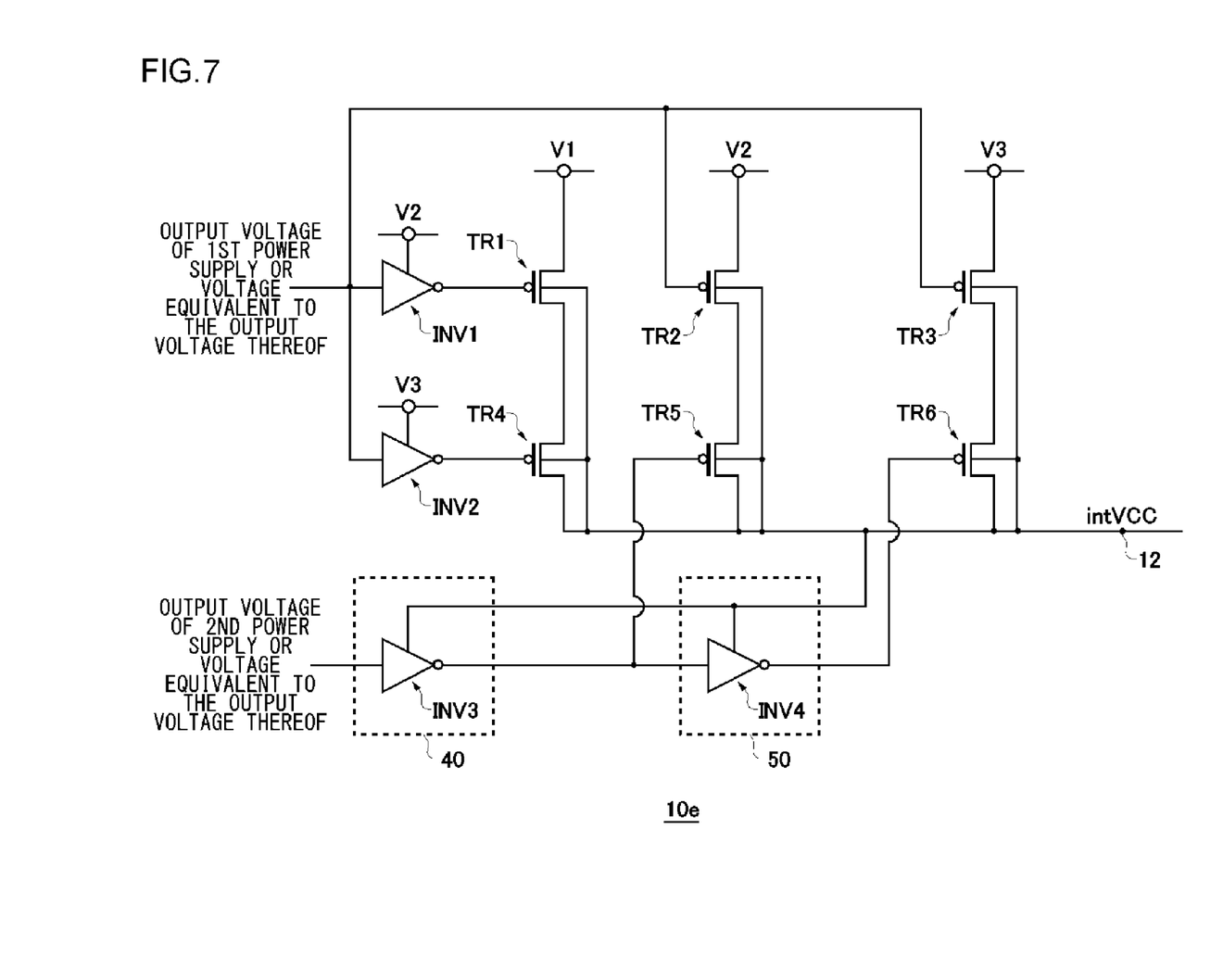
FIG. 7 shows a configuration of a power supply circuit according to a fifth embodiment of the present invention.

FIG. 7 shows a configuration of a power supply circuit 10e according to a fifth embodiment of the present invention. Similar to FIG. 5, FIG. 7 also shows that the first power supply, the second power supply and the third power supply are all connected and that the first power supply voltage V1, the second power supply voltage V2 and the third power supply voltage V3 are supplied to the power supply circuit 10e. In the power supply circuit 10c of FIG. 5, the third inverter INV3 is driven with the third power supply voltage V3 as the power supply voltage. As compared with the power supply circuit 10c of FIG. 5, the power supply circuit 10e is configured such that the third inverter INV3 is driven with the internal power supply voltage intVCC as the power supply voltage. Also, though in the power supply circuit 10c the fourth supply unit 50 is constituted by the wiring, in the power supply circuit 10e the fourth supply unit 50 is configured by including a fourth inverter INV4 for inverting the output voltage of the third inverter INV3. Such a configuration as described above realizes a compact power supply circuit 10e. Note that, as with the power supply circuit 10d shown in FIG. 6, an output of the detector 60 may be inputted to the first inverter INV1, the second inverter INV2, the second transistor TR2 and the third transistor TR3.

The present invention has been described based on the exemplary embodiments. The exemplary embodiments are intended to be illustrative only, and it is understood by those skilled in the art that various modifications to constituting elements and processes as well as arbitrary combinations thereof could be further developed and that such modifications and combinations are also within the scope of the present invention.

What is claimed is:

1. A power supply circuit for generating an internal power supply voltage from a first power supply capable of supplying a first power supply voltage if connected to a first power supply terminal and a second power supply capable of supplying a second power supply voltage, which is lower than the first power supply voltage, if connected to a second power supply terminal, the first power supply and the second power supply being separate from each other, the power supply circuit comprising:
   a first transistor provided between the first power supply terminal and an output node;
   a second transistor provided between the second power supply terminal and the output node;
   a first supply unit having an input for receiving a voltage representative of a voltage of the first power supply terminal and configured to continuously supply an inverted value of the input to a gate input of said first transistor; and
   a second supply unit configured to continuously supply the voltage representative of the voltage of the first power supply to a gate input of said second transistor.

2. A power supply circuit according to claim 1, wherein the first power supply is an external power supply, and when the first power supply is connected to said power supply circuit, said first supply unit receives an input of the first power supply voltage and outputs a low-level voltage to the gate input of the said first transistor, and wherein when the first power supply is not connected to said power supply circuit, said first supply unit receives no input of the first power supply voltage and outputs a high-level voltage to the gate input of said first transistor.

3. A power supply circuit, according to claim 1, for generating the internal power supply voltage from the first power supply, the second power supply and a third power supply capable of supplying a third power supply voltage, which is lower than the second power supply voltage, the power supply circuit further comprising a third transistor provided between the third power supply and the output node,
   wherein said second supply unit supplies the output voltage of the first power supply or the voltage corresponding to the output voltage of the first power supply, to a gate input of said third transistor.

4. A power supply circuit, according to claim 2, for generating the internal power supply voltage from the first power supply, the second power supply and a third power supply capable of supplying a third power supply voltage, which is lower than the second power supply voltage, the power supply circuit further comprising a third transistor provided between the third power supply and the output node,
   wherein said second supply unit supplies the output voltage of the first power supply or the voltage corresponding to the output voltage of the first power supply, to a gate input of said third transistor.

5. A power supply circuit according to claim 3, further comprising:
   a fourth transistor provided between the first power supply and the output node;
   a fifth transistor provided between the second power supply and the output node; and
   a sixth transistor provided between the third power supply and the output node,
   wherein a source of said first transistor is connected to the first power supply, a drain of said first transistor is connected to a source of said fourth transistor, and a drain of said fourth transistor is connected to the output node,
   wherein a source of said second transistor is connected to the second power supply, a drain of said second transistor is connected to a source of said fifth transistor, and a drain of said fifth transistor is connected to the output node, and
   wherein a source of said third transistor is connected to the third power supply, a drain of said third transistor is connected to a source of said sixth transistor, and a drain of said sixth transistor is connected to the output node.

6. A power supply circuit according to claim 4, further comprising:
   a fourth transistor provided between the first power supply and the output node;
   a fifth transistor provided between the second power supply and the output node; and
   a sixth transistor provided between the third power supply and the output node,
   wherein a source of said first transistor is connected to the first power supply, a drain of said first transistor is connected to a source of said fourth transistor, and a drain of said fourth transistor is connected to the output node,
   wherein a source of said second transistor is connected to the second power supply, a drain of said second transistor is connected to a source of said fifth transistor, and a drain of said fifth transistor is connected to the output node, and wherein a source of said third transistor is connected to the third power supply, a drain of said third transistor is connected to a source of said sixth transistor, and a drain of said sixth transistor is connected to the output node.

7. A power supply circuit according to claim 5, further comprising:
a third supply unit configured to supply the inverted value of an output voltage of the second power supply or the inverted value of a voltage corresponding to the output voltage of the second power supply, to a gate input of said fifth transistor; and
a fourth supply unit configured to supply the output voltage of the second power supply or the voltage corresponding to the output voltage of the second power supply, to a gate input of said sixth transistor.

8. A power supply circuit according to claim 6, further comprising:
a third supply unit configured to supply the inverted value of an output voltage of the second power supply or the inverted value of a voltage corresponding to the output voltage of the second power supply, to a gate input of said fifth transistor; and
a fourth supply unit configured to supply the output voltage of the second power supply or the voltage corresponding to the output voltage of the second power supply, to a gate input of said sixth transistor.

9. A power supply circuit for generating an internal power supply voltage from one of first and second power supply voltage terminals, comprising:
an input node for continuously receiving a voltage representative of a voltage of the first power supply voltage terminal;
an inverter having an input coupled to the input node, and an output;
a first transistor having a first current electrode coupled to the first power supply voltage terminal, a gate coupled to the output of the inverter, and a second current electrode coupled to an output node, the output node providing the internal power supply voltage; and
a second transistor having a first current electrode coupled to the second power supply voltage terminal, a gate coupled to the input node, and a second current electrode coupled to the output node.

10. The power supply circuit of claim 9 wherein:
the inverter has a power supply input coupled to the second power supply voltage terminal.

11. The power supply circuit of claim 9 wherein:
the first and second transistors are P-channel MOS transistors.

12. The power supply circuit of claim 9 wherein:
the voltage at the first power supply terminal is greater than the voltage at the second power supply terminal when both the first and second power supply voltages are present.

13. The power supply circuit of claim 9 wherein:
the first transistor has a back gate connected to a back gate of the second transistor.

14. The power supply circuit of claim 9, further comprising:
a third transistor having a first current electrode coupled to a third power supply voltage terminal, a gate coupled to the input node, and a second current electrode coupled to the output node.

15. The power supply circuit of claim 14, further comprising:
a fourth transistor coupled between the second current electrode of the first transistor and the output node and having a gate for receiving a voltage corresponding to an inverse of a level of the first supply voltage;
a fifth transistor coupled between the second current electrode of the second transistor and the output node and having a gate for receiving a voltage corresponding to an inverse of a level of the second supply voltage; and
a sixth transistor coupled between the second current electrode of the third transistor and the output node and having a gate for receiving a voltage corresponding to the level of the second supply voltage.

16. A method for generating an internal power supply voltage on an output node from one of first and second power supply voltage terminals, comprising:
continuously receiving a voltage representative of a first power supply at a first power supply voltage terminal if the first power supply is connected to the first power supply terminal;
continuously receiving a voltage representative of a second power supply at a second power supply voltage terminal if the second power supply is connected to the second power supply terminal;
if the first power supply is connected to the first power voltage terminal, switching the first power voltage terminal to the output node using a first transistor; and
if the second power supply is connected to the second power voltage terminal and the first power supply is not connected to the first power supply voltage terminal, switching the second power supply voltage terminal to the output node using a second transistor.

17. The method of claim 16, wherein:
the switching the first power voltage terminal to the output node using the first transistor comprises driving a low voltage on a gate of a first P-channel MOS transistor.

18. The method of claim 17, wherein:
the driving the low voltage on a gate of the first P-channel MOS transistor comprises inverting a level of the first power supply voltage on the gate of the first P-channel MOS transistor.

19. The method of claim 16, wherein:
the switching the second power voltage terminal to the output node using the second transistor comprises driving a low voltage on a gate of a second P-channel MOS transistor.

20. The method of claim 19, wherein:
the driving the low voltage on the gate of the second P-channel MOS transistor comprises providing a level of the first power supply voltage on the gate of the second P-channel MOS transistor.

* * * * *